United States Patent [19]
Pla

[11] Patent Number: 5,419,198
[45] Date of Patent: May 30, 1995

[54] ELECTRONIC SIGNAL ENHANCEMENT AND SEPARATION FOR MACHINERY DIAGNOSTICS

[75] Inventor: Frederic G. Pla, Clifton Park, N.Y.

[73] Assignee: General Electric Company, Schenectady, N.Y.

[21] Appl. No.: 856,261

[22] Filed: Mar. 23, 1992

[51] Int. Cl.$^6$ ............................................. G06F 15/31
[52] U.S. Cl. ...................................... 73/660; 364/572; 364/508
[58] Field of Search ................. 73/660, 593, 650, 658, 73/659; 364/508, 572

[56] References Cited

U.S. PATENT DOCUMENTS

| | | | |
|---|---|---|---|
| 3,681,978 | 8/1972 | Mathias et al. | 73/660 |
| 4,607,528 | 8/1986 | Kallergis | 73/660 |
| 4,796,213 | 1/1989 | Blotenberg | 364/572 |
| 4,988,979 | 1/1991 | Sasaki et al. | 364/508 |
| 5,029,118 | 7/1991 | Nakajima et al. | 364/572 |
| 5,157,596 | 10/1992 | Alcone | 364/572 |

OTHER PUBLICATIONS

Bernard Widrow et al., "Adaptive Noise Cancelling: Principles and Applications," *Proceedings of the IEEE*, vol. 63, No. 12, Dec. 1975, pp. 1692–1716.

*Primary Examiner*—Hezron E. Williams
*Assistant Examiner*—Rose M. Finley
*Attorney, Agent, or Firm*—Patrick R. Scanlon; Paul R. Webb, II

[57] ABSTRACT

A signal enhancement system for separating a composite diagnostic signal detected in a rotating machine into component signals representative of the contributions to the composite signal of a number of independent sources. The signal enhancement system includes at least one signal subtraction loop having a transducer which produces a reference signal based on the rotational speed of a rotating shaft in the machine and an adaptive filter connected to the transducer. The adaptive filter processes the reference signal to produce a component signal which closely approximates the contribution of the rotating shaft to the composite signal. A summer is also included which subtracts the component signal from the composite diagnostic signal to produce a second component signal. Both the first and second component signals are provided as outputs of the system. The system can be implemented with a plurality of signal subtraction loops wherein, the summer of the first loop subtracts the component signal of the first loop's adaptive filter from the composite diagnostic signal to produce an output signal. Then, the summer of each successive loop subtracts the component signal of that loop's adaptive filter from the output signal of the prior loop. The last output signal and each component signal are the system output.

3 Claims, 3 Drawing Sheets

ELECTRONIC SIGNAL ENHANCEMENT AND SEPARATION FOR MACHINERY DIAGNOSTICS

BACKGROUND OF THE INVENTION

This invention relates generally to diagnostic processes for rotating machinery and more particularly concerns a system which "cleans electronic diagnostic signals by separating such signals into component signals representing independent contributions from individual sources of the overall signal.

In many applications, the performance of rotating machinery must be monitored for diagnostic purposes. This is typically accomplished using a sensor which produces a diagnostic signal representing an operating characteristic of the machine. For instance, it is often desirable to monitor a specific vibration level within an aircraft engine, but a diagnostic sensor cannot be properly positioned inside of the engine because it would tend to interfere with engine operation. A diagnostic sensor is thus typically mounted in a non-invasive fashion to the outer casing of the engine. However, since the sensor mounted to the casing is sensitive not only to the vibrations of interest but to many other vibrations occurring in the engine as well, the diagnostic signal produced by the sensor becomes a "composite" signal having contributions from all of the sensed vibration sources. Thus, analyzing the diagnostic signals from a non-invasively mounted sensor is often rendered difficult or even impossible because they can become highly contaminated by secondary sources.

Some conventional diagnostic analyzing systems use time averaging methods to eliminate random noise from diagnostic signals. Frequency domain post processing techniques such as cepstrum analysis are also used in some of the most advanced systems. However, these methods are complex, require time consuming frequency domain processing, and are limited in their ability to separate random and periodic signals from different sources.

Thus, there exists a need for a system and method for processing diagnostic signals which can quickly separate a "composite" diagnostic signal into the component signals representative of the contribution from independent sources and thus "clean-up" the desired signal.

SUMMARY OF THE INVENTION

The present invention generally fulfills the above-mentioned need by providing a signal enhancement system which enhances and separates Composite diagnostic signals emitted by sensors monitoring machinery having at least one rotatable shaft. The signal enhancement system comprises at least one signal subtraction loop which includes a transducer that produces a reference signal based on the rotational speed of the shaft and an adaptive filter connected to the transducer. The adaptive filter processes the reference signal to produce a component signal which closely approximates the contribution of the rotating shaft to the composite signal. A summer is also included which subtracts the component signal from the composite diagnostic signal to produce an output signal. Means are provided for independently outputting the component and output signals.

In the case where the machine has more than one rotatable shaft, a plurality of signal subtraction loops are provided, one for each shaft. In this arrangement, the summer of the first loop subtracts the component signal of the first loop's adaptive filter from the composite diagnostic signal to produce an output signal. Then, the summer of each successive loop subtracts the component signal from that loop's adaptive filter from the output signal of the prior loop. The last output signal and each component signal are the system output.

Other objects and advantages of the present invention will become apparent upon reading the following detailed description and the appended claims and upon reference to the accompanying drawings.

DESCRIPTION OF THE DRAWINGS

The subject matter which is regarded as the invention is particularly pointed out and distinctly claimed in the concluding portion of the specification. The invention, however, may be best understood by reference to the following description taken in conjunction with the accompanying drawing figures in which:

DETAILED DESCRIPTION OF THE INVENTION

Figure 1:
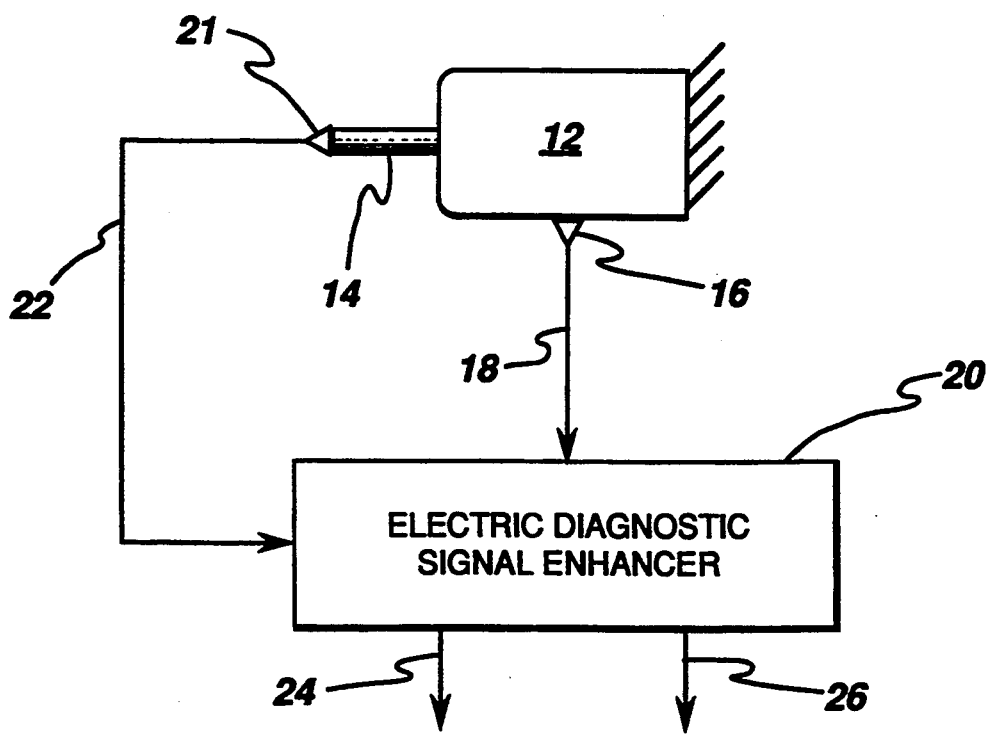
FIG. 1 is a schematic view of the present invention as implemented with a machine having one rotatable shaft.

Turning to FIG. 1, a schematic representation of the present invention is shown. The present invention is used with a machine 12 which has at least one rotatable shaft 14. Prime examples of appropriate machinery are aircraft engines or power generation turbine devices, although the present invention is applicable to just about all forms of rotating machinery. A diagnostic sensor 16 is attached to the housing of the machine 12. As described herein, the sensor 16 is a vibration sensor such as an accelerometer. However, this is only an illustrative example. The present invention is not limited to vibrational analyses; it is applicable to many other diagnostic processes. The sensor 16 senses the vibration level in the machine 12 and produces a diagnostic signal 18 representative thereof. The vibration level in the machine 12 typically results from many vibration sources, one being the rotation of the rotatable shaft 14. Thus, the diagnostic signal 18 is a composite signal representing the vibrations from each source. The composite diagnostic signal 18 is fed to a signal enhancer 20.

A transducer 21 is provided for sensing the rotational speed of the shaft 14 and producing a corresponding reference signal 22 which is also fed to the signal enhancer 20. The reference signal 22 is a time waveform having a frequency equal to the shaft rotational frequency and its harmonics. The reference signal 22 is thus correlated in some unknown way to the contribution of the rotating shaft 14 to the composite signal 18. The transducer can be any suitable device capable of generating a signal at the shaft rotational frequency and harmonics of that frequency, such as a tachometer. In response to the inputs of the composite diagnostic signal 18 and the reference signal 22, the signal enhancer 20 separates the composite signal into first and second component signals 24, 26 which are produced as system output. As further explained below, the first component signal 24 represents the contribution of the rotating shaft 14 to the composite signal, and the second component signal 26 represents vibrations due to sources other than shaft rotation.

Figure 2:
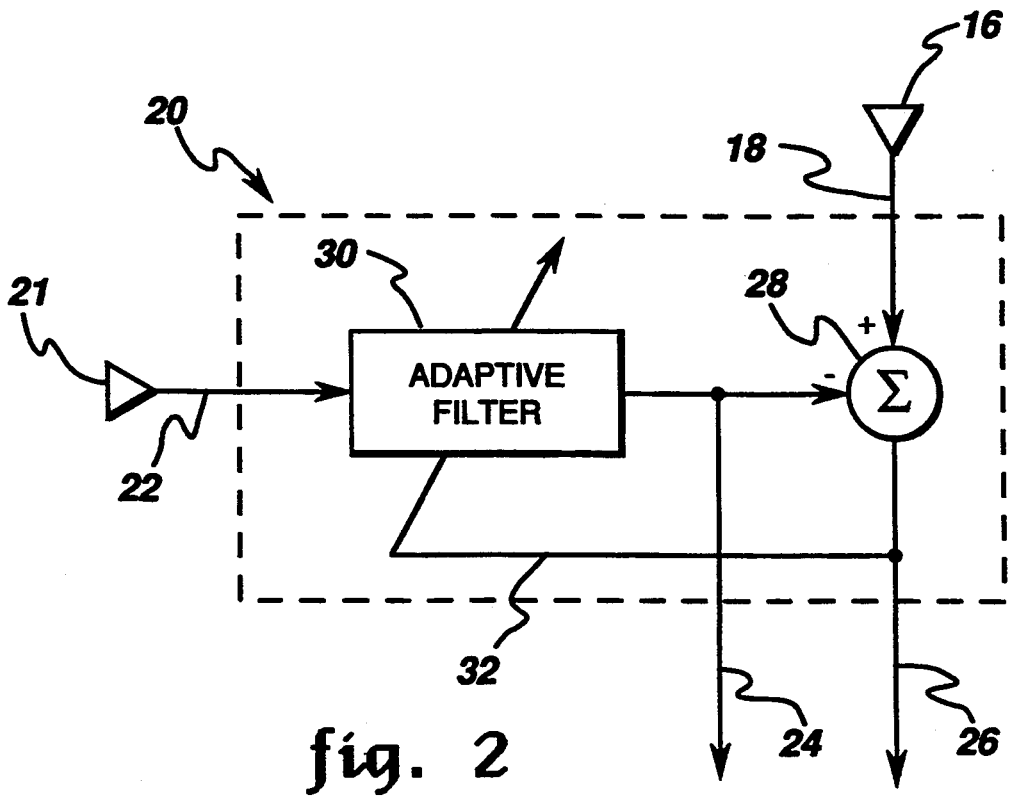
FIG. 2 is a block diagram of the signal enhancer of FIG. 1.

FIG. 2 shows the signal enhancer 20 in more detail. The composite diagnostic signal 18 is fed directly to a summer 28 while the reference signal 22 is fed to an adaptive filter 30. The adaptive filter 30 processes the reference signal to produce an output which closely approximates the contribution of the rotatable shaft 14 to the composite signal 18. This output of the adaptive filter is the first component signal 24. In addition to being produced as system output, the first component signal 24 is fed to the summer 28. The summer 28 subtracts the first component signal 24 from the composite signal 18 to produce an output which represents the vibrations in the machine 12 that are not derived from the rotatable shaft 14. This output of the summer 28 is the second component signal 26. The present invention can be used with digital or analog signals. Thus, the system input signals 18,22 can be fed through analog-to-digital convertors (not shown) prior to being inputted to the signal enhancer 20, if necessary.

The adaptive filter 30 utilizes a Least Mean Square (LMS) algorithm which adjusts the coefficients of the adaptive filter until the difference of the diagnostic composite signal 18 and the adaptive filter output (the first component signal 24) is minimized. Adjustment is accomplished in part through the feedback of the summer output (the second component signal 26) to the adaptive filter 30 as shown at reference numeral 32. A suitable LMS adaptive filter and LMS algorithm are described in the article "Adaptive Noise Cancelling: Principles and Applications," *Proceedings of the IEEE*, Volume 63, Number 12, December 1975, pages 1692–1716, by Bernard Widrow et al. This adaptive filter can operate under changing conditions and can readjust itself continuously to minimize the output of the summer 28.

Figure 3:
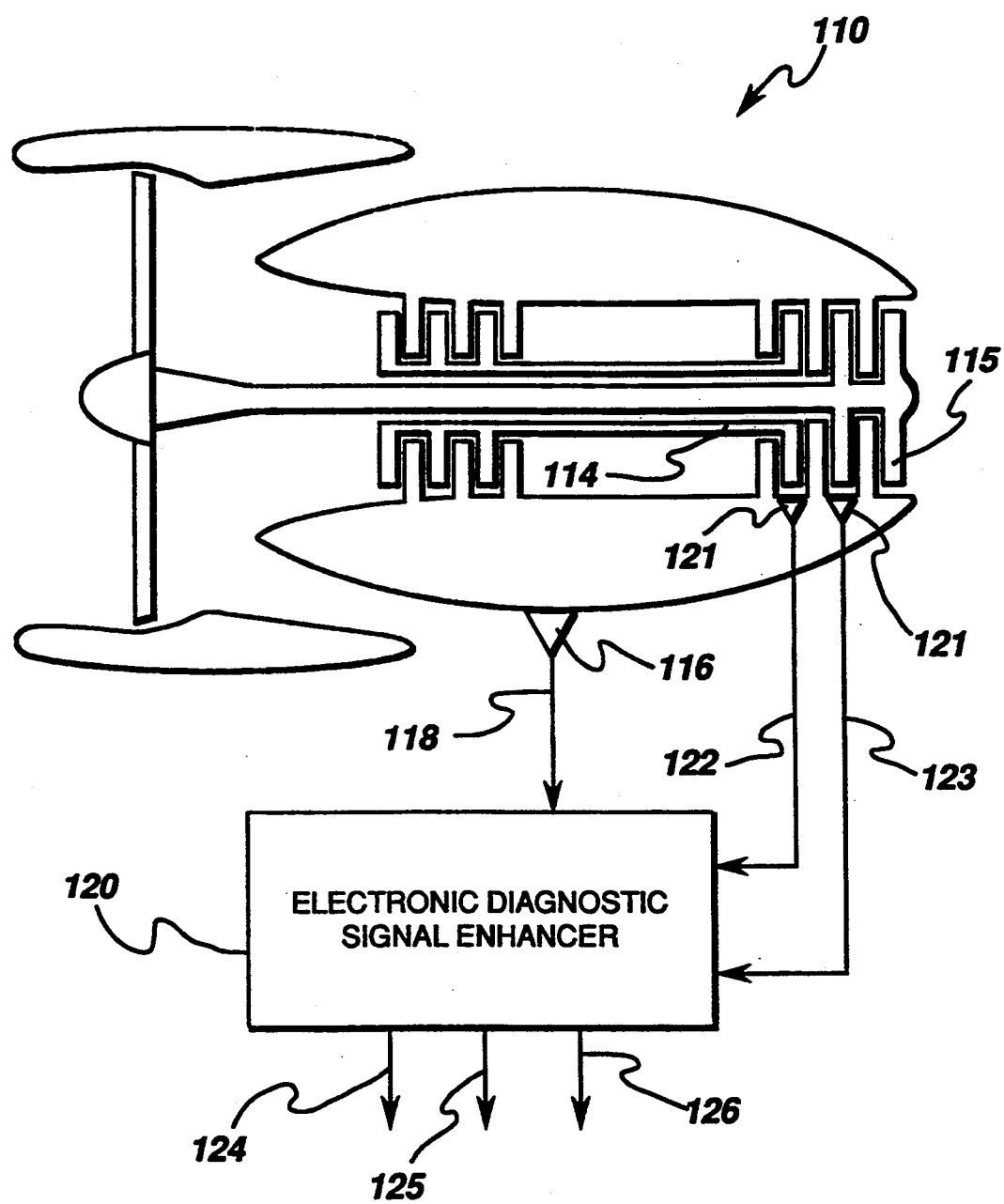
FIG. 3 is a schematic view of the present invention as implemented with a machine having two rotatable shafts.

The present invention is also applicable to machines having more than one rotatable shaft. An example of such a machine is a high bypass turbofan aircraft engine, although other multiple rotor machines are equally applicable. FIG. 3 schematically shows the present invention as used with a high bypass turbofan aircraft engine 110. The engine 110 includes a high pressure spool (HPS) having a HPS rotatable shaft 114 and a low pressure spool (LPS) having an LPS rotatable shaft 115. As the engine per se does not form an inventive part of the present invention, the structural details of the engine are not necessary to an understanding of the present invention and will not be described further.

A sensor 116 is mounted to the outer casing of the engine 110 to sense a physical characteristic of the engine. As with the first embodiment, the sensed characteristic described herein is vibration level. However, it is again noted that this is only for illustrative purposes, and many other diagnostic parameters can be analyzed. Vibrations occurring in the engine 110 can result from a number of different sources including aerodynamic loadings, combustor vibrations and airframe vibrations, as well as vibrations due to the rotation of the two shafts 114,115. The sensor 116 thus produces a diagnostic signal 118 which is a composite signal representing vibrations from each source. A transducer 121 is associated with each of the two shafts 114,115 for sensing the rotational speed of the respective shaft. The transducers 121 produce reference signals 122,123 which correspond to the rotational frequencies and harmonics of the respective shafts. These signals are thus correlated to the vibration contributions of the two shafts.

A signal enhancer 120 is also provided. The signal enhancer 120 receives inputs of the composite diagnostic signal 118 and the reference signals 122,123. In response to these inputs, the signal enhancer 120 separates the composite signal into first, second and third component signals 124, 125,126 which are produced as system output. As further explained below, the first component signal 124 represents the contribution of the HPS shaft 114 to the composite signal, the second component signal 125 represents the contribution of the LPS shaft 115, and the third component signal 126 represents vibrations due to sources other than shaft rotation, such as aerodynamic loadings, combustor vibrations and airframe vibrations.

Figure 4:
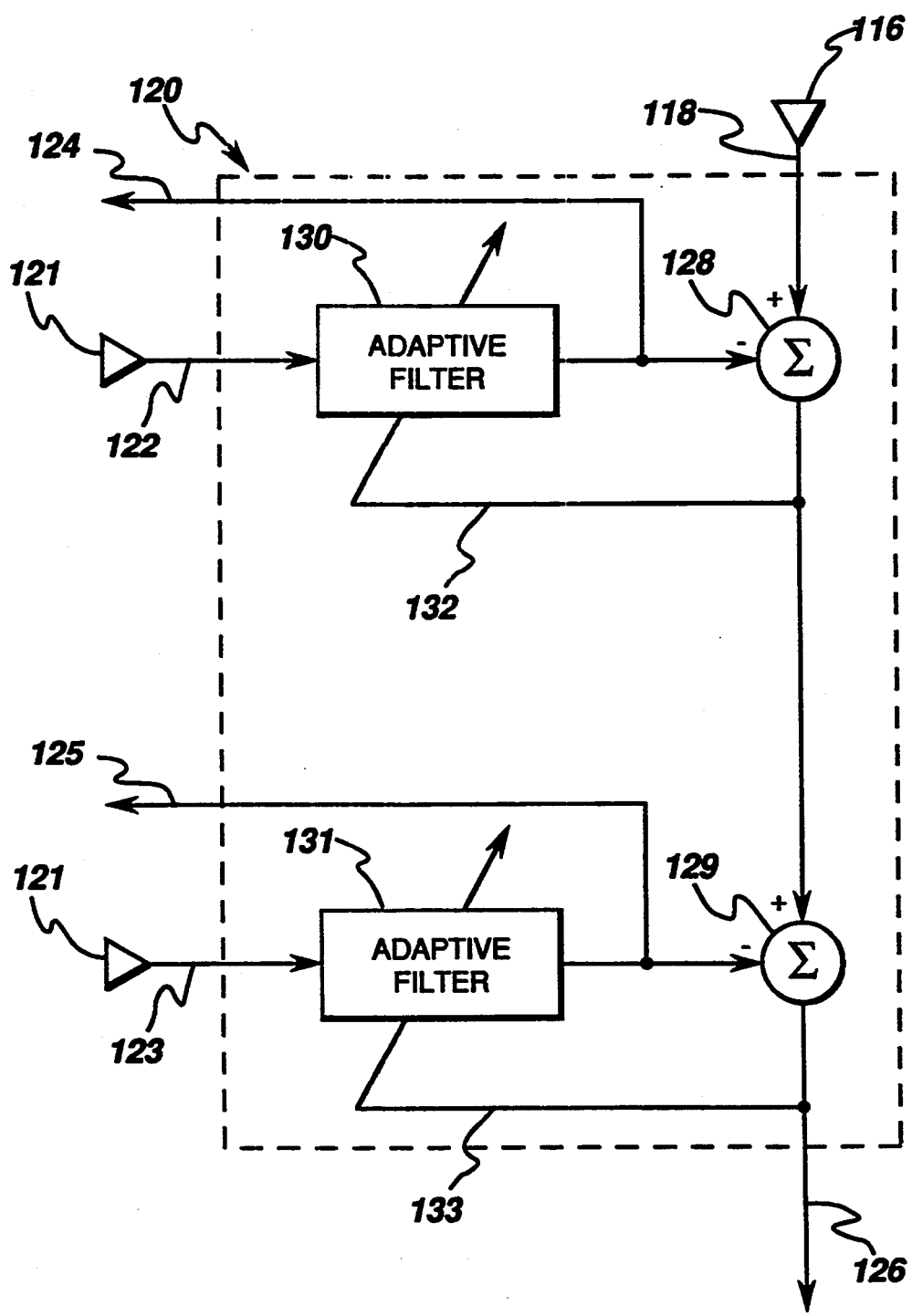
FIG. 4 is a block diagram of the signal enhancer of FIG. 3.

FIG. 4 shows the signal enhancer 120 in further detail. Here, the signal enhancer can be viewed as having two signal subtraction loops, one loop corresponding to each rotatable shaft. Each signal subtraction loop comprises a reference signal input, an adaptive filter, a summer, and a feedback of the summer output to the adaptive filter. In FIG. 4, the first composite loop receives an input of the composite signal 118, which is fed directly to a first summer 128. The HPS reference signal 122 is fed to a first adaptive filter 130. The adaptive filter processes the reference signal 122 to produce an output which closely approximates the contribution of the HPS shaft 114 to the composite vibration signal. The output of the first adaptive filter 130, which is outputted from the system as the first component signal 124, is also fed to the first summer 128. The first summer 128 subtracts the first adaptive filter output from the diagnostic signal 118 and produces an output of this difference. As shown at reference numeral 132, the first summer output, which represents the contributions of the LPS shaft 115 and sources other than shaft rotation to the composite signal, is fed back to the first adaptive filter 130.

The first summer output is also fed to a second summer 129 as the primary input to the second subtraction loop. The LPS reference signal 123 is fed to a second adaptive filter 131 which processes the signal 123 to produce an output which closely approximates the contribution of the LPS shaft 115 to the composite vibration signal 118. This output of the second adaptive filter 131 is the second component signal 125. In addition to being produced as a system output, the second component signal 125 is fed to the second summer 129. The second summer 129 subtracts the signal 125 from the output of the first summer 128. The output of the second summer 129 represents vibrations not attributable to either of the two rotatable shafts and is the third component signal 126. As seen at reference numeral 133 the signal 126 is fed back to the second adaptive filter.

The above embodiment uses two signal subtraction loops for extracting the contributions of two sources of vibrations (the two rotatable shafts 114,115). However, the present invention can be extended for extracting the contributions of more than two vibration sources, as long as a reference signal which is adequately correlated to each source can be determined. To do so, a signal subtraction loop would be provided for each independent vibration source. In such an arrangement, the summer of the first loop subtracts the component signal produced by the first loop's adaptive filter from the composite diagnostic signal to produce an output signal. Then, the summer of each successive loop subtracts the component signal of that loop's adaptive filter from the output signal of the prior loop. The last output signal and each component signal are the system outputs.

The foregoing has described a system and method for separating a composite diagnostic signal detected in rotating machinery into a number of component signals representative of the contributions to the composite signal of a number of independent sources.

While specific embodiments of the present invention have been described, it will be apparent to those skilled in the art that various modifications thereto can be made without departing from the spirit and scope of the invention as defined in the appended claims.

What is claimed is:

1. A signal enhancement system for separating a composite diagnostic signal emitted by a sensor monitoring a machine having a plurality of rotating shafts into component signals, said signal enhancement system comprising:
    a first transducer means for producing a first reference signal based on the rotational speed of a first one of the plurality of rotating shafts;
    a first adaptive filter having an input connected to said first transducer means, said first adaptive filter processing the first reference signal to produce a first component signal which closely approximates the contribution of the first rotating shaft to the composite signal;
    a first signal subtracting means for subtracting the first component signal from the composite diagnostic signal to produce an intermediate composite signal;
    means for providing a feedback of the intermediate composite signal to said first adaptive filter;
    a second transducer means for producing a second reference signal based on the rotational speed of a second one of the plurality of rotating shafts;
    a second adaptive filter having an input connected to said second transducer means, said second adaptive filter processing the second reference signal to produce a second component signal which closely approximates the contribution of the second rotating shaft to the composite signal;
    a second signal subtracting means for subtracting the second component signal from the intermediate composite signal to produce a third component signal;
    means for providing a feedback of the third component signal to said second adaptive filter; and
    means for independently outputting the first, second and third component signals.

2. A signal enhancement system for separating a composite diagnostic signal emitted by a sensor monitoring a machine having a plurality of rotating shafts into component signals, said signal enhancement system comprising:
    a plurality of transducer means, each one of said transducer means being associated with a respective one of the plurality of rotating shafts, for producing a reference signal based on the rotational speed of the respective rotating shaft;
    a plurality of adaptive filters, each one of said adaptive filters having an input connected to a respective one of said plurality of transducer means, each adaptive filter processing the respective reference signal to produce a component signal which closely approximates the contribution of the respective rotating shaft to the composite signal;
    a plurality of signal subtracting means, each one of said signal subtracting means being associated with a respective one of said plurality of adaptive filters, for subtracting the respective component signal from an input signal to produce an output signal, wherein the input signal of one of said plurality of signal subtraction means is the composite signal and the input signal of each other signal subtraction means is the output signal from another one of said signal subtraction means;
    means for providing a feedback of each output signal to a respective adaptive filter; and
    means for independently outputting one of the output signals and each component signal.

3. A method for separating a composite diagnostic signal emitted by a sensor monitoring a machine having a plurality of rotating shafts into component signals, said method comprising the steps of:
    determining a reference signal for at least a number of the plurality of rotating shafts, each reference signal being based on the rotational speed of the respective rotating shaft;
    filtering each reference signal through a respective adaptive filter to produce a component signal which closely approximates the contribution of the respective rotating shaft to the composite signal;
    subtracting each component signal from a respective input signal to produce a respective output signal, wherein one of the input signals is the composite signal and each other input signal is a respective one of the output signals;
    providing a feedback of each output signal to its respective adaptive filter; and
    independently outputting a final output signal and each of the component signals.

* * * * *